(12) United States Patent
Kaneko et al.

(10) Patent No.: US 7,195,846 B2
(45) Date of Patent: Mar. 27, 2007

(54) METHODS OF MANUFACTURING PHOTOMASK BLANK AND PHOTOMASK

(75) Inventors: Hideo Kaneko, Nakakubiki-gun (JP); Yukio Inazuki, Nakakubiki-gun (JP); Tetsushi Tsukamoto, Nakakubiki-gun (JP); Masayuki Mogi, Nakakubiki-gun (JP); Katsuya Okumura, Shinjuku-ku (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 205 days.

(21) Appl. No.: 10/724,734

(22) Filed: Dec. 2, 2003

(65) Prior Publication Data

US 2004/0110073 A1 Jun. 10, 2004

(30) Foreign Application Priority Data

Dec. 3, 2002 (JP) .............................. 2002-351465
Oct. 15, 2003 (JP) .............................. 2003-354602

(51) Int. Cl.
*G03F 1/00* (2006.01)
*G03C 5/00* (2006.01)

(52) U.S. Cl. .......................................... 430/5; 430/330
(58) Field of Classification Search .................... 430/5, 430/270, 270.1, 330; 428/428, 336
See application file for complete search history.

(56) References Cited

U.S. PATENT DOCUMENTS 4,619,894 A * 10/1986 Bozler et al. ............ 430/270.1
5,907,393 A 5/1999 Kawano et al.
6,376,806 B2 * 4/2002 Yoo .......................... 219/411
6,677,087 B2 * 1/2004 Nozawa et al. ................ 430/5
6,746,806 B2 * 6/2004 Nozawa ......................... 430/5
6,770,519 B2 * 8/2004 Ito et al. ..................... 438/197
6,806,021 B2 * 10/2004 Sato et al. ................... 430/198
2002/0058186 A1 5/2002 Nozawa et al.

FOREIGN PATENT DOCUMENTS

EP 1 132 772 A1 12/2001
JP 7-140635 A 2/1995

* cited by examiner

*Primary Examiner*—S. Rosasco
(74) *Attorney, Agent, or Firm*—Birch, Stewart, Kolasch & Birch, LLP

(57) ABSTRACT

A photomask blank having a film of at least one layer formed on a substrate is manufactured by forming a film on a substrate and irradiating the film with light from a flash lamp. A photomask is manufactured from the thus manufactured photomask blank by forming a patterned resist on the film on the blank by photolithography, etching away those portions of the film which are not covered with the resist, and removing the resist. The photomask blank and photomask have minimized warpage and improved chemical resistance.

13 Claims, No Drawings

METHODS OF MANUFACTURING PHOTOMASK BLANK AND PHOTOMASK

This Nonprovisional application claims priority under 35 U.S.C. §119(a) on patent application Ser. No(s). 2002-351465 and 2003-354602 filed in JAPAN on Dec. 3, 2002 and Oct. 15, 2003, respectively, the entire contents of which are hereby incorporated by reference.

BACKGROUND OF THE INVENTION

1. Field of the Invention

The present invention relates to methods for manufacturing photomask blanks and photomasks suitable for use in the microfabrication of semiconductor integrated circuits, charge coupled devices (CCD), liquid crystal display (LCD) color filters, magnetic heads and the like.

2. Prior Art

Photomasks are used in a broad range of applications including the manufacture of semiconductor integrated circuits as typified by ICs and LSIs. The photomask basically comprises a light-transmissive substrate and a desired pattern of light-shielding film of chromium or the like formed thereon. The market demand for ever higher levels of integration in semiconductor integrated circuits has led to a rapid reduction in the minimum feature size of photomask patterns. Such miniaturization has been achieved in part by the use of shorter wavelength exposure light.

Although exposure using shorter wavelength light does improve resolution, it has undesirable effects, such as reducing the focal depth, lowering process stability and adversely impacting product yield.

One pattern transfer technique that has been effective for resolving such problems is phase shifting. This involves the use of a phase shift mask as the mask for transferring microscopic patterns.

The phase shift mask is constructed such that the phase of light changes with locations where light is transmitted, whereby a fine pattern is formed utilizing the interference between lights of different phases. The phase shift mask is generally composed of a substrate on which a phase shift film is patterned. The mask has both exposed substrate areas (first light-transmitting areas) on which there is no phase shift film, and phase shifters (second light-transmitting areas) that form a pattern region on the mask. The phase shift mask improves the contrast of a transferred image by providing a phase difference of 180 degrees between light passing through the pattern region and light passing through the non-pattern region, and utilizing the destructive interference of light at the boundary regions of the pattern to set the light intensity in the areas of interference to zero. The use of phase shifting also makes it possible to increase the focal depth at the necessary resolution. Hence, compared with a conventional mask having an ordinary light-exposure pattern made of chromium film, the phase shift mask can improve resolution and increase the margin of the exposure process.

For practical purposes, the phase shift masks can be broadly categorized, according to the light-transmitting characteristics of the phase shifter, as either completely transmitting phase shift masks or halftone phase shift masks. Completely transmitting phase shift masks are masks in which the phase shifter has the same light transmittance as the substrate, and which are thus transparent to light of the exposure wavelength. In halftone phase shift masks, the phase shifter has a light transmittance that ranges from about several percent to several tens of percent the transmittance of exposed substrate areas.

The halftone phase shift masks proposed thus far are halftone phase shift masks of the single-layer type which are simple in structure. Single-layer halftone phase shift masks known to the art include those described in JP-A 7-140635 which have a phase shifting film composed of molybdenum silicide oxide (MoSiO) or molybdenum silicide oxynitride (MoSiON).

Such phase shift masks are manufactured by lithographically patterning phase shift mask blanks. The lithography involves the step of applying a resist onto a phase shift mask blank, irradiating selected portions of the resist with electron beams or ultraviolet radiation, developing the resist, and etching desired portions of the phase shift film. Thereafter, the resist film is stripped, leaving a phase shift mask.

In a photomask blank like the phase shift mask blank discussed above, a film like the phase shift film is generally formed on a substrate by sputtering. Stresses are induced in the film, by which the substrate is distorted. The resulting photomask blank is thus warped. If a photomask is manufactured through patterning of such a photomask blank, the warpage of the substrate is locally resumed to the original state prior to film formation because the film is partially removed by patterning. The resulting substrate has varying degrees of flatness. These changes introduce positional shifts between the mask blank during the pattern exposure and the actually finished mask. Such positional shifts have a larger influence as the mask pattern becomes finer, and the warpage sometimes cause focal shifts.

In manufacturing a photomask from a photomask blank, wash liquids are used to remove surface stains and foreign matter. The wash liquids used include acids such as sulfuric acid, and alkali solutions such as aqueous ammonia and a mixture of aqueous ammonia and aqueous hydrogen peroxide. Most films used in photomask blanks and photomasks are not enough resistant to such chemicals as acids and alkalis, and in particular, the phase shift film undergoes an undesirable change of phase difference by alkali treatment.

SUMMARY OF THE INVENTION

An object of the invention, which is made to overcome the above-discussed problems, is to provide a method for manufacturing a photomask blank of quality having minimized warpage and improved chemical resistance and a method for manufacturing a photomask therefrom.

It has been found that by forming a film on a transparent substrate and irradiating the film with light from a flash lamp, the resulting photomask blank is minimized in warpage and the film is improved in chemical resistance.

In a first aspect, the present invention provides a method for manufacturing a photomask blank having a film of at least one layer formed on a substrate, comprising the steps of forming a film on a substrate, and irradiating the film with light from a flash lamp.

Preferably the film is formed by sputtering. The film preferably has a lower light transmittance than the substrate. Typically, the film is a phase shift film which contains silicon, at least one metal other than silicon, and at least one element selected from among oxygen, carbon and nitrogen.

In a second aspect, the present invention provides a method for manufacturing a photomask comprising the steps of forming a patterned resist on the film on the photomask blank manufactured by the method of the first aspect, by photolithography; etching away those portions of the film which are not covered with the resist; and removing the resist.

The method of the invention minimizes the warpage of a photomask blank and improves the chemical resistance of a photomask blank and photomask, and in particular, restrains the phase shift film from changing its phase difference by alkali treatment.

Therefore, by the methods of the invention, a photomask blank and photomask of quality having minimized warpage and improved chemical resistance are obtained.

DESCRIPTION OF THE PREFERRED EMBODIMENTS

According to the invention, a photomask blank is manufactured by forming a film such as a phase shift film, a light-shielding-film or an antireflection film on a substrate, and irradiating the film with light from a flash lamp.

Irradiation of films including a phase shift film, a light-shielding film, and an antireflection film with light from a flash lamp improves the films. This is presumably because the atomic bond state, the quantity of defects, surface composition (e.g., degree of oxidation, degree of nitriding) and other factors of the films change due to the absorption of light, abrupt temperature changes of the films or combinations thereof. However, even when the films are irradiated with a flash lamp in an inert gas atmosphere, chemical resistance improvement and stress reduction are achieved. This fact suggests that the improvement by the invention is not a simple effect by oxidation of the surface.

The flash lamp is a light source that produces flashes of light of short duration having a continuous wide wavelength spectrum. A typical flash lamp includes a tube of light-transmissive material such as glass and a gas fill such as xenon contained therein wherein a high voltage is applied in pulses to emit light. Unlike the laser, the flash lamp eliminates a need to form a film having peak light absorption (or low transmittance) at a certain wavelength and minimizes a limit on the quality of film to which the flash lamp is effective. The flash lamp permits an effective quantity of energy to be irradiated over the entire surface all at once and within a short time, eliminating a need for light scanning. Because of a wide wavelength spectrum, the effects of varying wavelengths are exerted at the same time. Film quality may be improved by suitable methods using a hot plate, a heater, a halogen lamp, an IR lamp, and a rapid thermal processor (RTP). However, these methods are less effective. If more energy is introduced in order to achieve better effects with these methods, the substrate experiences a temperature ramp and is thus damaged. Additionally, a certain time is taken for heating, leading to low productivity. For these reasons, irradiation using a flash lamp is more effective for improving film quality.

The power to the flash lamp must be adjusted to provide an appropriate intensity of irradiation because light of too high an intensity can cause the film to be scattered away or roughened and too weak light is less effective for improving film quality. The intensity of irradiation is preferably in a range of 0.1 to 100 $J/cm^2$, more preferably 1 to 50 $J/cm^2$, most preferably 10 to 50 $J/cm^2$, although it varies with the type and composition of film to be irradiated.

In the case of a multilayer film, film stress mitigation and other improvements are possible with flash lamp irradiation while the layer structure and the functions of respective layers are maintained.

The time of irradiation should preferably be not too long. Irradiation of a short time can alter only the film without substantially heating the substrate. The time of irradiation is preferably up to 1 second, more preferably up to 0.1 second, most preferably up to 0.01 second.

The atmosphere for flash lamp irradiation is not particularly limited and may be an inert gas such as argon, nitrogen gas, oxygen gas, a mixture of two or more such gases, vacuum, or air. When oxidation or nitriding takes place in the film bulk or on the film surface, or if such oxidation or nitriding is desired, irradiation may be done in an oxygen or nitrogen-containing atmosphere. When oxidation or nitriding of the film should be avoided, the film-bearing substrate may be placed in an inert gas or vacuum atmosphere where irradiation is performed.

When the film deposited on the substrate is irradiated with a flash lamp, irradiation may be completed in one flash or in plural flashes. If the film has a multilayer structure, irradiation may be done whenever a layer is deposited or wholly after a plurality of layers are deposited. Alternatively, irradiation is done after a layer which is desired to improve its properties is deposited, and layers are subsequently deposited thereon. In a particular embodiment wherein a phase shift mask blank comprising a phase shift film of a single layer or plural layers formed on a substrate, and a light-shielding film or an antireflection film in the form of a metal film, typically a chromium film, formed thereon is manufactured, if there is a risk that the light-shielding film can be scattered away upon irradiation of light with a power sufficient to achieve the desired effect on the phase shift film, it is recommended that the phase shift film as deposited be irradiated with flash light before a metal film is formed thereon. The side of light incidence may be either the surface of the film or the rear surface of the substrate opposite to the film if the substrate is transmissive to light.

For the substrate, a transparent substrate of synthetic quartz glass or calcium fluoride is preferred. The film formed thereon should preferably have a lower light transmittance than the substrate because the flash lamp light becomes more effective to the film than to the substrate.

Formation of films such as a phase shift film, light-shielding film and antireflection film on the substrate may be performed by any well-known techniques. Film formation by a sputtering technique is preferred because flash light irradiation according to the invention is more effective to a sputtered film with respect to warpage reduction and chemical resistance enhancement. Of the sputtering techniques, a reactive sputtering technique is preferred when light elements such as oxygen, nitrogen and carbon should be contained in the film. A film may be deposited by sputtering a target of a predetermined composition in a sputtering gas atmosphere containing the selected light element.

The sputtering gas used during film deposition may be an inert gas such as argon, to which oxygen, nitrogen, or a gas containing oxygen, nitrogen and/or carbon such as nitrogen oxides or carbon oxides is added so that the film deposited may have the desired composition.

The sputtering process may employ either a direct-current (DC) power supply or a radio-frequency (RF) power supply. Either a magnetron sputtering system or a conventional sputtering system may be used. The film-forming system may be either a continuous, in-line system or a single-workpiece processing system.

In the practice of the invention, the film to be irradiated with a flash lamp may be any film which is formed on a substrate to construct a photomask blank. A phase shift film, a light-shielding film, an antireflection film and the like are included, with the phase shift film being preferred as the film to be irradiated. In particular, a phase shift film of the halftone type having a higher absorbance of exposure light than the substrate acquires greater effects from flash light irradiation because even a slight change of film quality by chemical liquid treatment should be avoided, and stress reduction is achieved. If the relevant film is not fully absorptive to light, a supplemental light-absorptive layer may be formed prior to flash light irradiation.

The phase shift film is preferably one containing silicon and at least one metal other than silicon, and optionally one or more elements selected from among oxygen, nitrogen and carbon. The metal other than silicon is typically selected from among W, Mo, Ti, Ta, Zr, Hf, Nb, V, Co, Cr, and Ni. Those films based on molybdenum are preferred because they are given greater effects of warpage reduction and chemical resistance enhancement. Films of molybdenum silicide oxide (MoSiO), molybdenum silicide nitride (MoSiN), molybdenum silicide carbide (MoSiC), molybdenum silicide oxynitride (MoSiON), molybdenum silicide oxycarbide (MoSiOC), and molybdenum silicide oxide nitride carbide (MoSiONC) are especially preferred. These molybdenum silicide-based phase shift films can be formed by reactive sputtering using a target of MoSi or the like.

Also the thickness of the phase shift film is preferably in the range of 30 to 200 nm, especially in the range of 50 to 130 nm, although it varies with the exposure wavelength on use of the phase shift film, the transmittance of the phase shift film, and the quantity of phase shift.

It is understood that a light-shielding film may be formed on the phase shift film, and an antireflection film be formed thereon for reducing the reflection from the light-shielding film.

The light-shielding film or antireflection film may be a chromium-based film composed of chromium or a chromium compound containing chromium and at least one element selected from among oxygen, carbon and nitrogen or a laminate of such chromium-based films.

Such a chromium-based light-shielding or antireflection film may be deposited by reactive sputtering using a target made of elemental chromium or a chromium compound containing chromium and oxygen, carbon or nitrogen or a mixture of any, and a sputtering gas comprising an inert gas such as argon to which oxygen gas, nitrogen gas, nitrogen oxides, carbon oxides or hydrocarbons such as methane are added so that the film deposited may have a desired composition.

A phase shift mask is manufactured by forming a resist coating on the phase shift mask blank in which a phase shift film has been formed on a substrate as described above, patterning the resist coating by lithography, etching the phase shift film through the resist pattern, and stripping off the resist coating. Well-known techniques may be employed for application of the resist coating, patterning (exposure and development), etching and removal of the resist coating.

In the methods of manufacturing a photomask blank and a photomask according to the invention, not only the chemical resistance and stress of the film are improved by flash lamp irradiation, but the resistance to light exposure of the photomask during its use is also improved. In the event the film is a halftone phase shift film, the transmittance of the film can be adjusted as well.

EXAMPLE

Examples of the invention are given below by way of illustration and not by way of limitation.

Example 1

A phase shift film of molybdenum silicide oxynitride (MoSiON) was deposited on a quartz substrate of 6 inches square by a reactive DC sputtering technique using molybdenum silicide (MoSi) as the target while the thickness of the film was adjusted so as to provide a phase difference of 180°. The phase shift film had a thickness of 1,030 angstroms (103 nm) and a transmittance of 6% to light of 248 nm provided that the substrate without the film had a transmittance of 100%. The film had a warpage of 0.91 μm due to compressive stresses, as measured using a flatness tester FT-900 by Nidek Co., Ltd.

The phase shift film was treated in an argon atmosphere by irradiating in an energy dose of 15 J/cm$^2$ with a xenon flash lamp, obtaining a phase shift mask blank. On warpage measurement, the phase shift mask blank had a warpage of 0.29 μm due to tensile stresses.

Example 2

A phase shift mask blank manufactured by the similar procedure as in Example 1 was immersed in an alkaline solution consisting of 29% aqueous ammonia, 31% aqueous hydrogen peroxide and pure water in a volume ratio of 1:1:20 at 30° C. for 10 minutes, after which the phase difference was measured again. A change of phase difference before and after the immersion was computed. The sample showed a change of not more than 0.5° whereas a comparative sample which had not been irradiated with the xenon flash lamp showed a change of 4.9°. For phase measurement, a phase-shift measurement system MPM-248 by Lasertec Corp. was used.

Example 3

A phase shift film of molybdenum silicide oxynitride (MoSiON) was deposited on a quartz substrate of 6 inches square by a reactive DC sputtering technique using molybdenum silicide (MoSi) as the target and a mixture of $N_2$ and $O_2$ as the sputtering gas while the thickness of the film was adjusted so as to provide a phase difference of 180°. The phase shift film had a transmittance of 6% to light of 193 nm provided that the substrate without the film had a transmittance of 100%. The film had a warpage of 0.68 μm due to compressive stresses, as measured using a flatness tester FT-900 by Nidek Co., Ltd.

The phase shift film was treated in a nitrogen atmosphere by irradiating in an energy dose of 22 J/cm$^2$ with a xenon flash lamp, obtaining a phase shift mask blank. On warpage measurement, the phase shift mask blank had a warpage of 0.18 μm due to tensile stresses.

Comparative Example 1

A phase shift film was deposited on a substrate by the same procedure as in Example 1. The film had a warpage of 0.94 μm due to compressive stresses.

The phase shift film was irradiated with light from a halogen lamp in an argon atmosphere for 10 seconds, with light irradiated all over the entire film. A phase shift mask blank was obtained. When a silicon wafer was treated under the same conditions, the wafer surface was heated to a temperature above 800° C. On warpage measurement, the phase shift mask blank had a warpage of 0.86 μm due to compressive stresses.

Japanese Patent Application Nos. 2002-351465 and 2003-354602 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a photomask blank having a film of at least one layer formed on a substrate, comprising the steps of
    forming a film on a synthetic quartz glass substrate, and
    irradiating the entire surface of the film all at once with light from a flash lamp, wherein
    the film is a phase shift film, a light-shielding film or an antireflection film, and an intensity of the irradiation is in a range of 1 to 50 J/cm$^2$ and a duration of the irradiation is up to 1 second.

2. The method of claim 1 wherein the step of forming a film on a substrate includes sputtering.

3. The method of claim 1 wherein the film of at least one layer has a lower light transmittance than the substrate.

4. The method of claim 1 wherein the film is a phase shift film.

5. The method of claim 4 wherein said phase shift film contains silicon, at least one metal other than silicon, and at least one element selected from the group consisting of oxygen, carbon and nitrogen.

6. A method for manufacturing a photomask comprising the steps of:
    forming a patterned resist on the film on the photomask blank manufactured by the method of claim 1, by photolithography,
    etching away those portions of the film which are not covered with the resist, and removing the resist.

7. The method of claim 6, wherein the step of irradiation converts compressive stresses to tensile stresses and thus reduces warpage in the photomask compared to a photomask prepared without irradiation of the photomask blank.

8. The method of claim 6, wherein the step of irradiation reduces stresses in the film and thus reduces warpage in the photomask blank compared to a photomask blank not subjected to said irradiation.

9. The method of claim 1, wherein the step of irradiation converts compressive stresses to tensile stresses and thus reduces warpage in the photomask blank compared to a photomask blank not subjected to said irradiation.

10. The method of claim 1, wherein the step of irradiation reduces stresses in the film and thus reduces warpage in the photomask blank compared to a photomask blank not subjected to said irradiation.

11. The method of claim 1, wherein the intensity of the irradiation is in a range of 10 to 50 J/cm$^2$.

12. The method of claim 1, wherein the duration of the irradiation is up to 0.1 second.

13. The method of claim 1, wherein the duration of the irradiation is up to 0.01 second.

* * * * *